United States Patent
Wei et al.

(10) Patent No.: US 7,817,130 B2
(45) Date of Patent: Oct. 19, 2010

(54) SHIFT REGISTER

(75) Inventors: Chun-Ching Wei, Hsin-Chu (TW); Wei-Cheng Lin, Hsin-Chu (TW); Shih-Hsun Lo, Hsin-Chu (TW); Yang-En Wu, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 690 days.

(21) Appl. No.: 11/754,353

(22) Filed: May 28, 2007

(65) Prior Publication Data

US 2008/0143666 A1    Jun. 19, 2008

(30) Foreign Application Priority Data

May 30, 2006   (TW)   ............................... 95119190 A

(51) Int. Cl.
*G09G 3/36*   (2006.01)
(52) U.S. Cl. ......................................... 345/100; 377/64
(58) Field of Classification Search .................. 345/87, 345/98–100, 204; 377/64, 76, 78; 365/78
See application file for complete search history.

(56) References Cited

U.S. PATENT DOCUMENTS

| 6,845,140 | B2  |   | 1/2005 | Moon et al. |          |
|-----------|-----|---|--------|-------------|----------|
| 7,382,347 | B2  | * | 6/2008 | Sasaki et al. | ................. 345/100 |
| 7,495,648 | B2  | * | 2/2009 | Kang et al. | ................. 345/100 |

* cited by examiner

*Primary Examiner*—Abbas I Abdulselam
(74) *Attorney, Agent, or Firm*—Winston Hsu; Scott Margo; Min-Lee Teng

(57) ABSTRACT

A shift register includes a signal generating circuit, a driving circuit, a reset circuit, and a control switch. The signal generating circuit includes a first switch for generating a first output signal according to a clock signal while the first switch is turned on, and a second switch coupled to an output end of the shift register for generating and transmitting a second output signal to the output end of the shift register according to the clock signal while the second switch is turned on. The driving circuit is for controlling the first and second switches according to an input signal received from an input end of the shift register. The reset circuit is for turning off the first and second switches and resetting the output signal outputted by the output end. The control switch is for resetting the output signal outputted by the output end.

18 Claims, 8 Drawing Sheets

SHIFT REGISTER

BACKGROUND OF THE INVENTION

1. Field of the Invention

The present invention relates to a shift register, and more particularly, to a shift register with reduced response time.

2. Description of the Prior Art

A liquid crystal display (LCD) is a flat panel display fabricated on a glass substrate. To reduce the manufacturing cost, fabricating driving control circuits on the glass substrate has become a trend. In most cases, the driving control circuits are composed of thin film transistors (TFTs) using amorphous silicon, for example, as their semiconductor layer.

FIG. 1 illustrates a diagram of a conventional LCD 100. FIG. 2 illustrates a diagram of a gate driving circuit 120 of the LCD 100 of FIG. 1. FIG. 3 illustrates a diagram of a shift register 122 of the gate driving circuit 120 of FIG. 2. As shown in FIG. 1, the LCD 100 includes a display array 110, a control circuit 124, and a gate driving circuit 120. The display array 110 is utilized for displaying images. The control circuit 124 is utilized for generating signals, such as a first clock signal CK, a second clock signal XCK, and a start signal ST, required by the gate driving circuit 120 during operation, as shown in FIG. 2. The gate driving circuit 120 is utilized for driving the display array 110.

As illustrated in FIG. 2, the gate driving circuit 120 includes a plurality of shift registers 122. The shift registers 122 are coupled in a cascade. For each shift register 122, a corresponding gate signal GOUT is generated for sequentially driving the display array 110 in response to the first clock signal CK and the second clock signal XCK. The phase of the second clock signal XCK is generally opposite to the phase of the first clock signal CK. Each shift register 122 has an output end OUT, an input end IN, and a feedback end FB.

As illustrated in FIG. 3, the shift register 122 includes a signal generating circuit 310, a driving circuit 320, a reset circuit 330, and a control switch 340. The signal generating circuit 310 includes a switch $TFT_7$, which can be realized with a thin film transistor, for generating a gate signal GOUT(N) at the output end OUT of the shift register 122 in response to the first clock signal CK while the signal generating circuit 310 is turned on. Note that the gate signal GOUT(N) can also be generated in response to the second clock signal XCK. The driving circuit 320 is utilized for controlling the signal generating circuit 310 in response to the input signal received by the input end IN of the shift register 122. The input signal received by the input end IN of the shift register 122 is a gate signal GOUT(N−1) from the shift register 122 of the previous stage or the start signal ST. The reset circuit 330 is utilized for turning off the signal generating circuit 310 and for resetting the gate signal GOUT(N) outputted from the output end OUT. Specifically, the voltage of the output end is lowered to a predetermined voltage VSS by the reset circuit 330. The control switch 340 is utilized for resetting the gate signal GOUT(N) outputted by the output end OUT in response to the feedback signal received by the feedback end FB where the feedback signal received by the feedback end FB is a gate signal GOUT(N+1) from an output end of the shift register of the next stage.

Note that both the control switch 340 and the reset circuit 330 are both utilized for resetting the gate signal GOUT(N) outputted by the output end OUT; however, the control circuit 340 differs from the reset circuit 330 in that the control circuit 340 only operates after receiving a gate signal GOUT(N+1) from the shift register of the next stage. In contrast, the reset circuit 330 operates continuously for a long period of time. If a TFT keeps operating for a long period of time, its efficiency may decrease and its lifespan may be shortened as well. Therefore, in order to prevent the noise interference and prolong the lifespan of the shift register, the control switch 340 operates only once in an operation cycle.

The operation of the conventional shift register 122 is explained in detail with reference to FIGS. 3 and 4. FIG. 4 illustrates a timing diagram of each related signal of the shift register 122 of FIG. 3 during operation. As illustrated in FIG. 4, in the time period T1, the input signal received by the input end IN (i.e., the gate signal GOUT(N−1) from the output end of the shift register of the previous stage or a start signal ST) is raised to be high, thereby initializing a $TFT_1$ of the driving circuit 320, which in turn causes the $TFT_7$ of the signal generating circuit 310 to initialize as well. However, because the first clock signal CK at T1 is low, the gate signal GOUT(N) from the output end OUT remains low. Furthermore, the input signal GOUT(N−1) or the start signal ST initializes a $TFT_4$ of the reset circuit 330 to lower the voltage of the node $N_2$ to be low, and at the same time the reset circuit 330 also stops turning off the signal generating circuit 330. However, the voltage of the node $N_3$ is maintained to be high due to the DC voltage VDD, and thus the reset circuit 330 can reset the gate signal GOUT(N) of the output end OUT so that the gate signal GOUT(N) is lowered to be low. The control switch 340 does not operate because the feedback signal GOUT(N+1) of the feedback end FB is low.

At time period T2, the input signal GOUT(N−1) or start signal ST received by the input end IN is lowered to be low, and thus the $TFT_1$ of the driving circuit 320 is turned off; however, the $TFT_7$ of the signal generating circuit 310 is still turned on, and the voltage at the node $N_1$ is raised to be high due to parasitic capacitance when the first clock signal CK is raised to be high. Meanwhile, the voltage of the output end OUT is also raised to be high. Furthermore, the voltage at node N2 of the reset circuit 330 is low(the second clock signal XCK at T2 is low), so the signal generating circuit 310 is still turned off. The voltage at the node $N_3$ of the reset circuit 330 is lowered to be low ($TFT_6$ is turned on by the gate signal GOUT(N) from the output end OUT), such that the gate signal GOUT(N) from the output end OUT stops resetting. The control switch 340 does not operate because the feedback signal GOUT(N+1) of the feedback end FB is low.

At time period T3, when the feedback signal GOUT(N+1) of the feedback end FB rises to be high, $TFT_9$ of the control switch 340 is turned on and the gate signal GOUT(N) from the output end OUT is lowered to be low. Furthermore, the reset circuit 330 rises to be high in response to the second clock signal XCK while $TFT_2$ is turned on. As a result, $TFT_7$ of the signal generating circuit 310 is turned off. The reset circuit 330 also rises to be high at node N3 and resets the gate signal GOUT(N) outputted from the output end OUT again. Also the gate signal GOUT(N) from the output end OUT is lowered to be low.

Within subsequent periods of time, the reset circuit 330 will continue operating to turn off the signal generating circuit 310 and to lower the gate signal GOUT(N) outputted from the output end to be low until the input signal GOUT (N−1) of the input end IN or the start signal ST is again raised to be high. Also, a shift register 122 of the next stage will repeat the above-mentioned operations, so that the gate signal GOUT can be sequentially generated to drive the display array 110.

However, the gate signal GOUT from each stage shift register 122 is not only utilized for driving the display array 110, but also utilized for outputting to an input end IN of a next stage shift register 122 and a feedback end FB of a previous stage shift register 122, and therefore the work load of the output end OUT is increased. This action results in increasing the rising time of the gate signal GOUT from each stage shift register 122. While the rising time of the gate signal GOUT is increased, the feedback signal received by the shift register of the previous stage is weakened, hence increasing the falling time of the gate signal GOUT from the shift register 122 of the previous stage. Therefore, as can be seen, the conventional shift register has an undesired, long response time.

SUMMARY OF THE INVENTION

The present invention discloses a shift register that comprises an input end and an output end. The shift register comprises a signal generating circuit. The signal generating circuit comprises a first switch for generating a first output signal according to a clock signal when the first switch is turned on; and a second switch coupled to an output end of the shift register for generating a second output signal according to a clock signal when the second switch is turned on, and for transmitting the second output signal to the output end of the shift register. The shift register further comprises a drive circuit coupled to the first switch and the second switch of the signal generating circuit for controlling the first switch and the second switch of the signal generating circuit according to an input signal received by the input end of the shift register; a reset circuit coupled to the signal generating circuit for turning off the first switch and the second switch of the signal generating circuit and for resetting an output signal outputted by the output end; and a control switch coupled to the output end of the shift register for resetting the output signal outputted by the output end.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, consumer electronic equipment manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
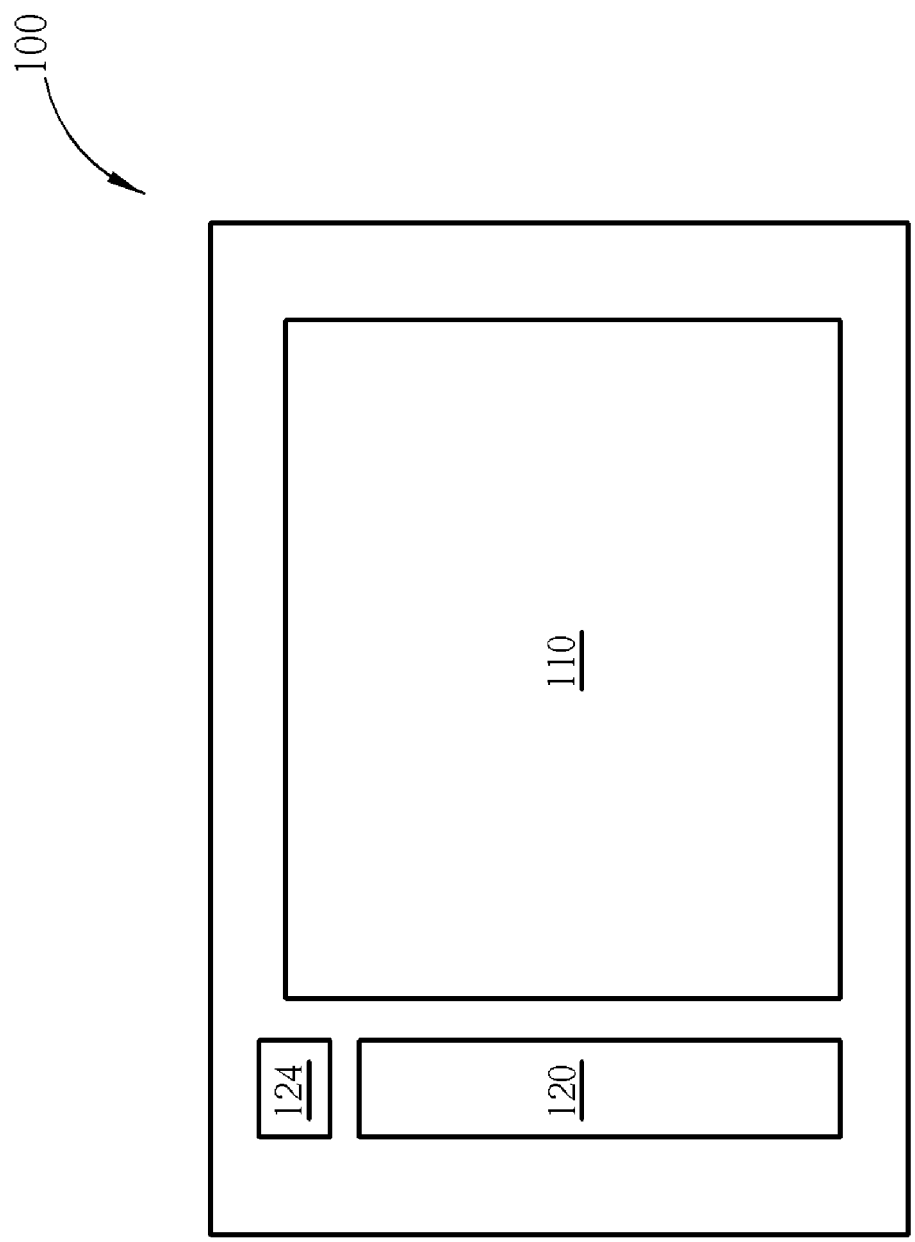
FIG. 1 illustrates a diagram of a conventional LCD.
Figure 2:
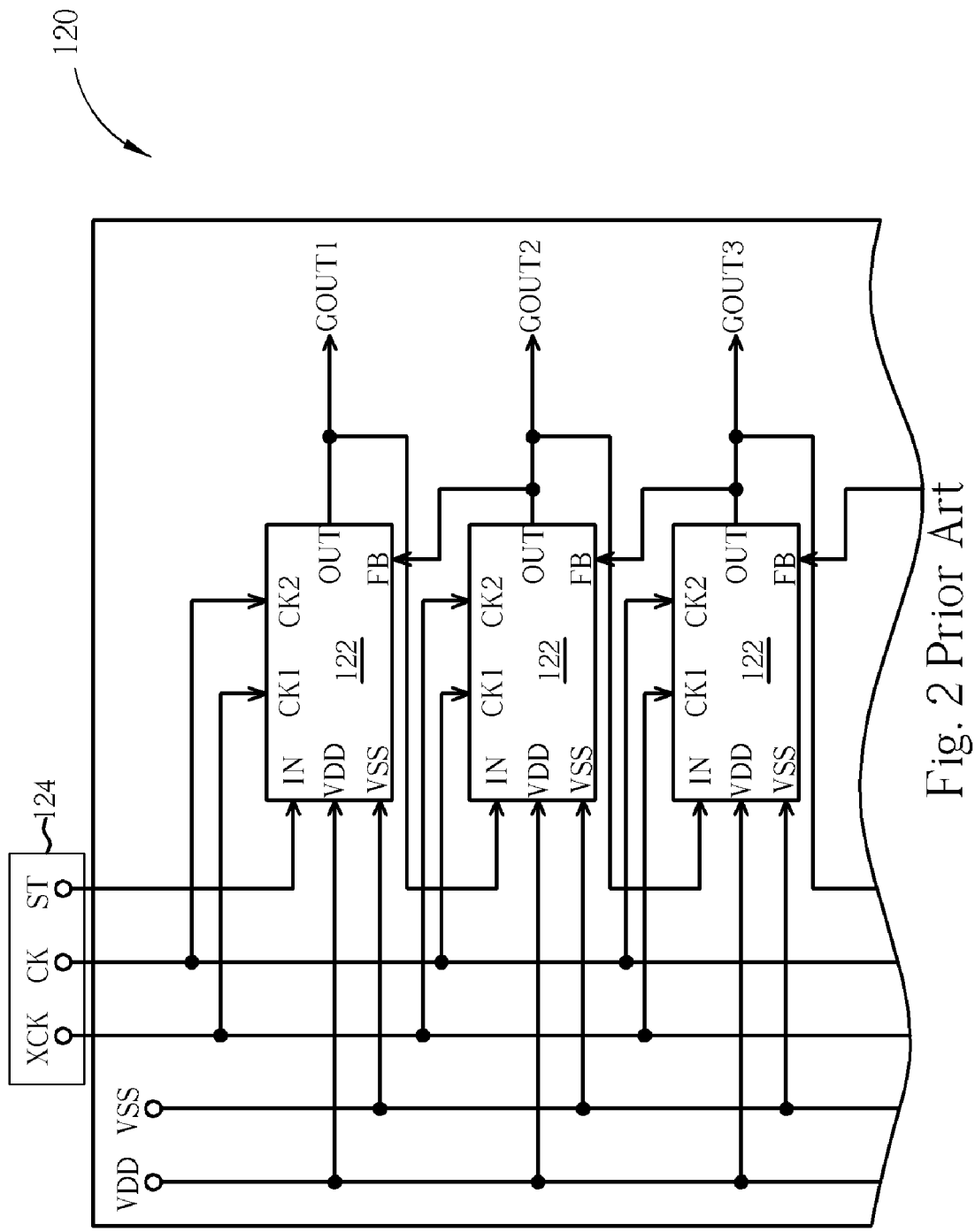
FIG. 2 illustrates a diagram of a gate driving circuit of the LCD of FIG. 1.
Figure 3:
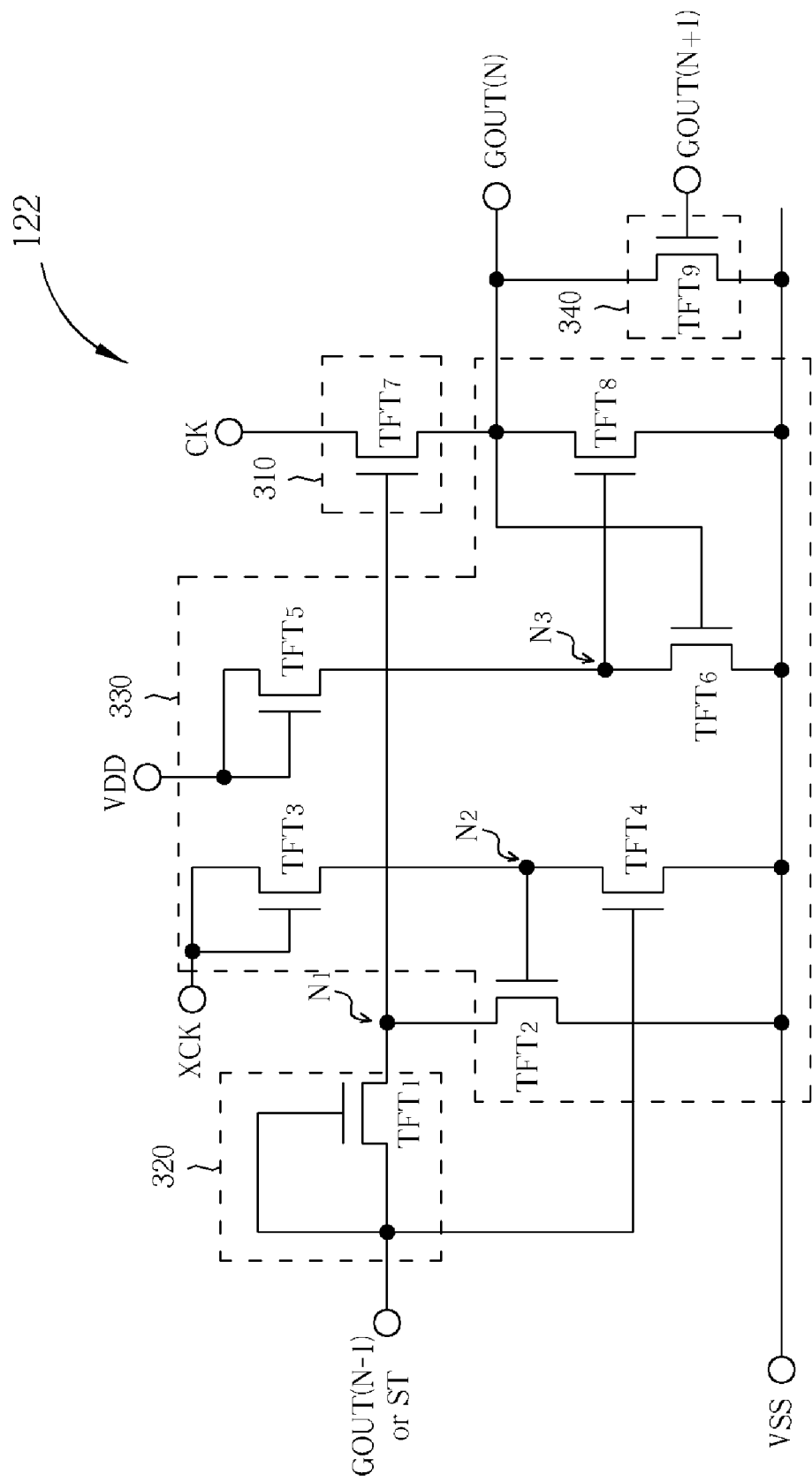
FIG. 3 illustrates a diagram of a shift register of the gate driving circuit of FIG. 2.
Figure 4:
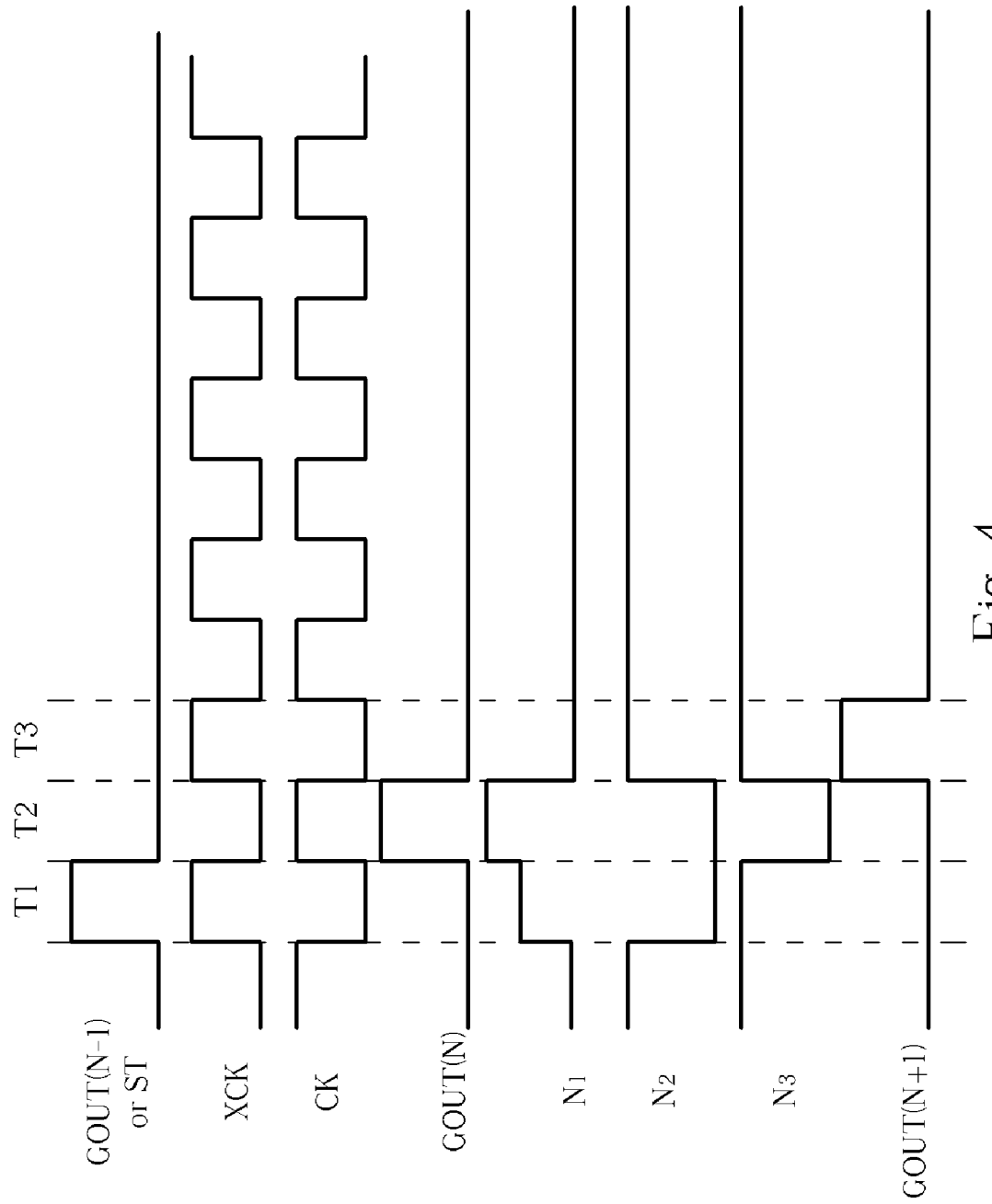
FIG. 4 illustrates a timing diagram of each related signal of the shift register of FIG. 3 during operation.
Figure 5:
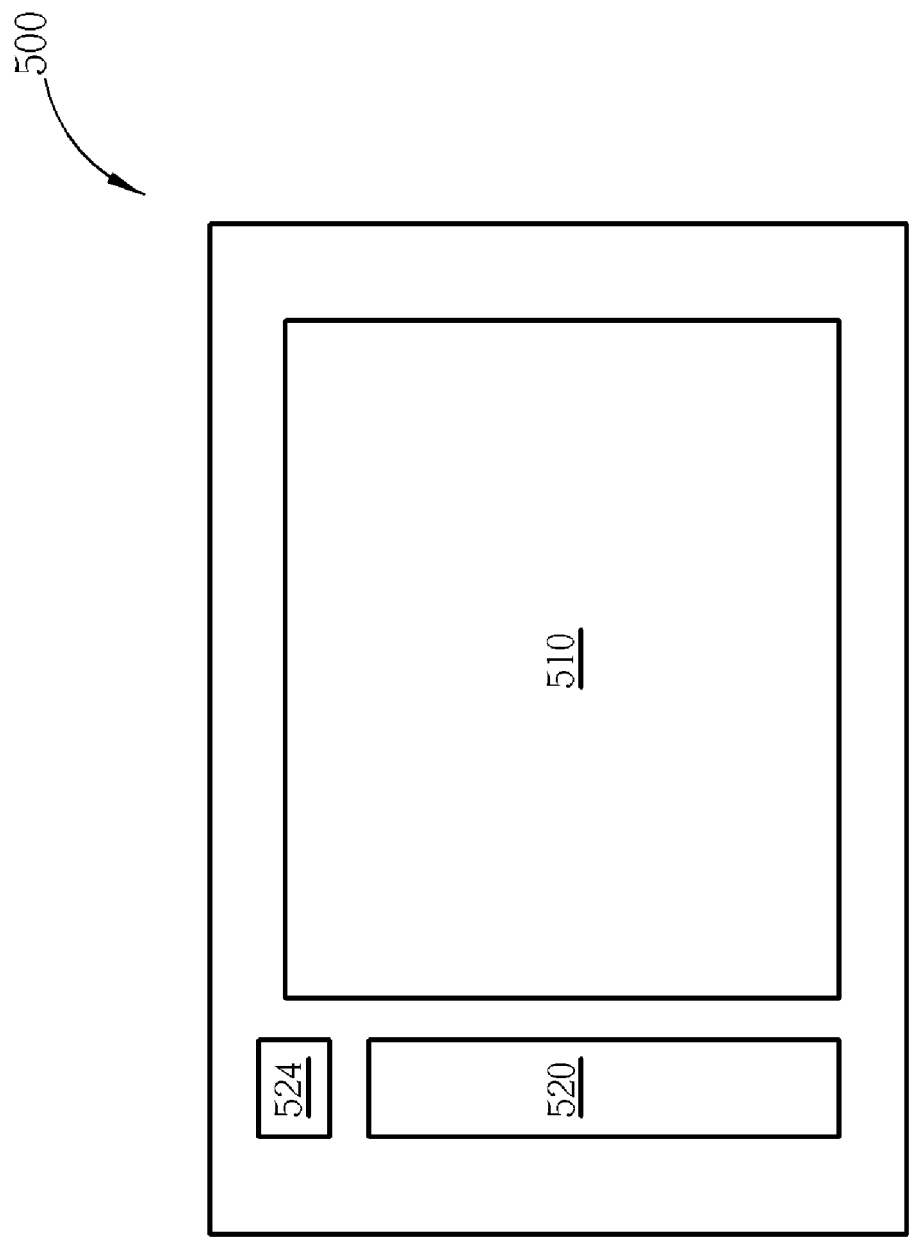
FIG. 5 illustrates a diagram of an LCD according to an embodiment of the present invention.
Figure 6:
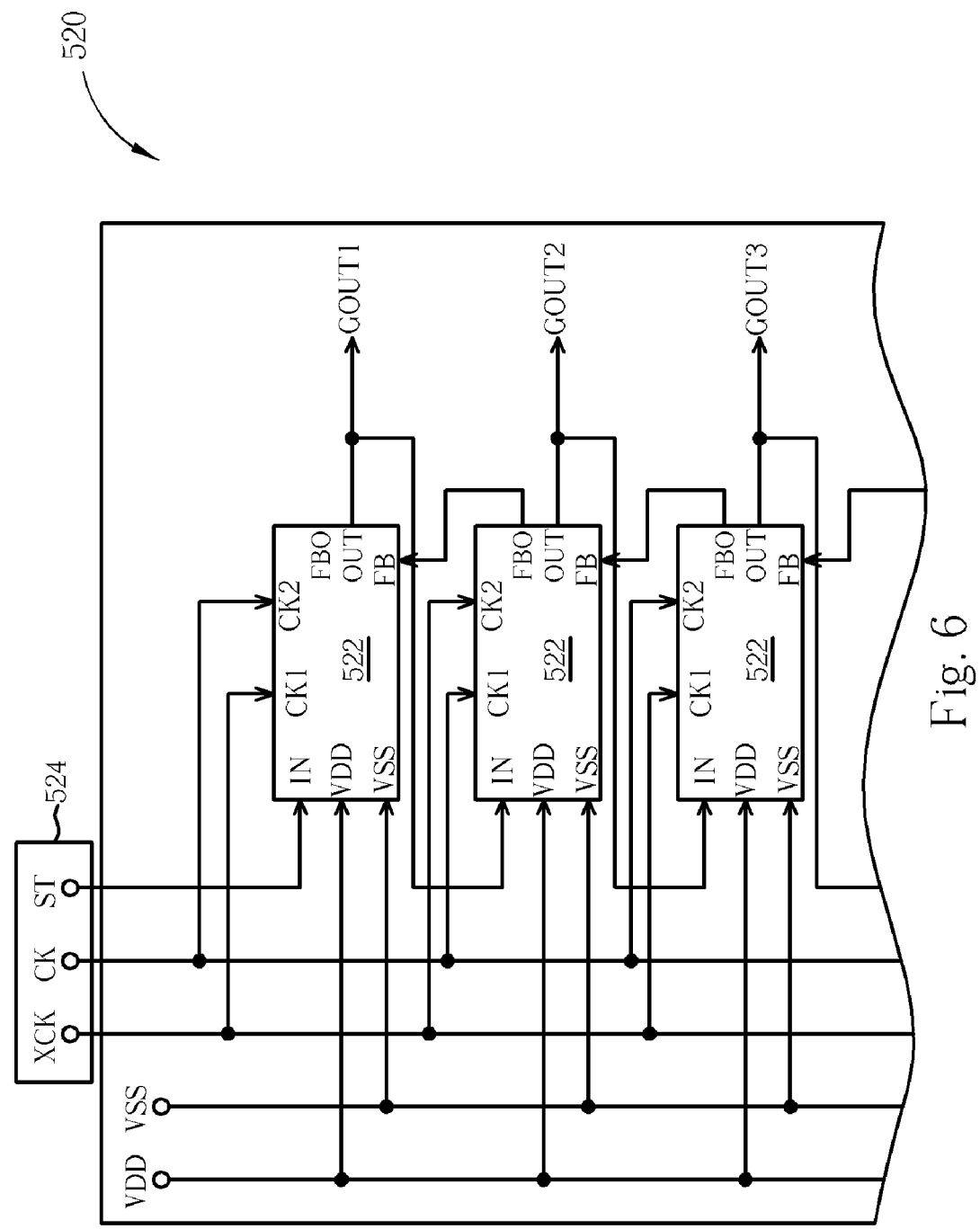
FIG. 6 illustrates a diagram of a gate driving circuit of the LCD of FIG. 5.
Figure 7:
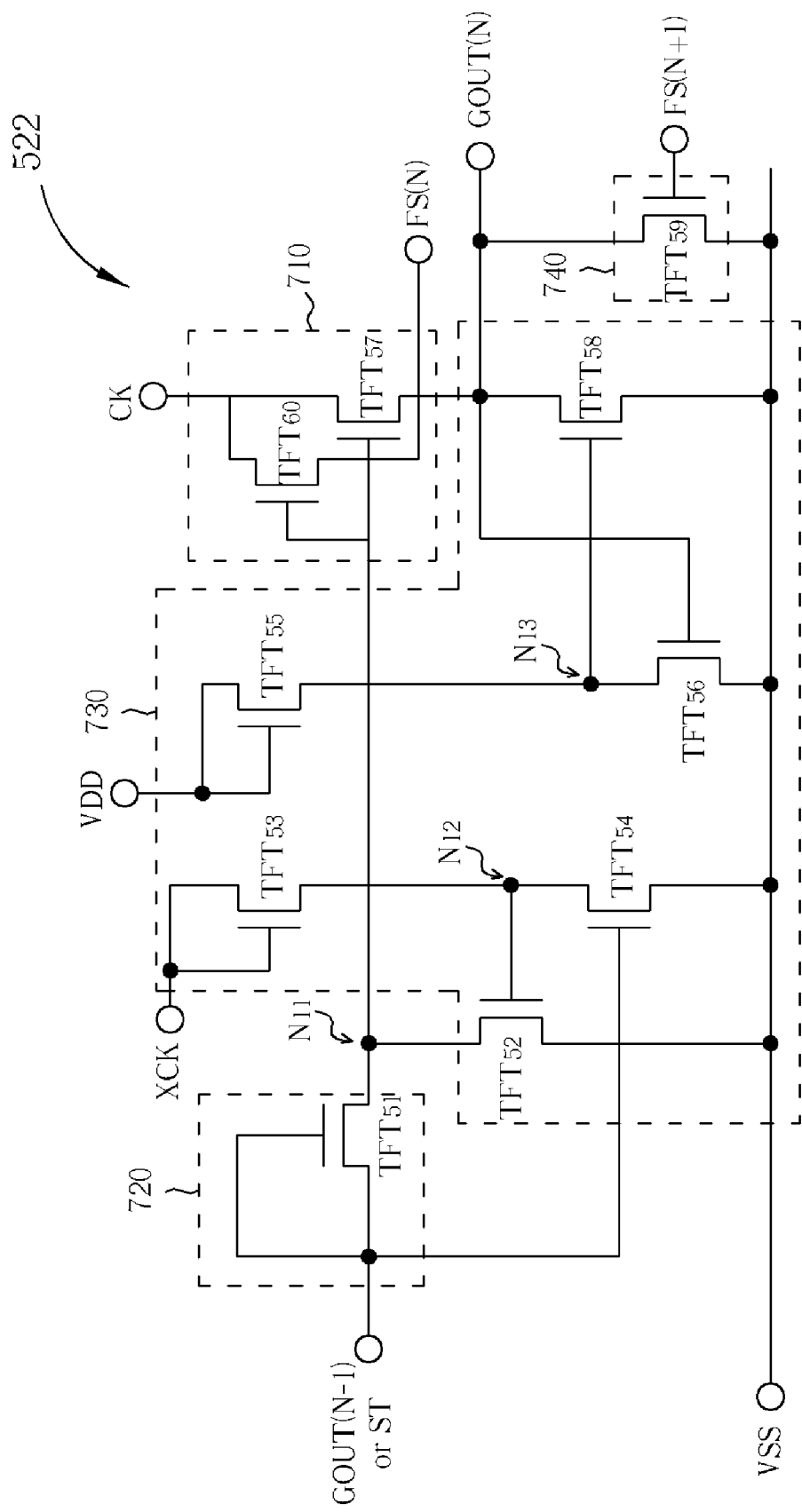
FIG. 7 illustrates a diagram of a shift register of the gate driving circuit of FIG. 6.

Referring to FIG. 5 through FIG. 7, FIG. 5 illustrates a diagram of an LCD 500 according to an embodiment of the present invention. FIG. 6 illustrates a diagram of a gate driving circuit 520 of the LCD 500 of FIG. 5. FIG. 7 illustrates a diagram of a shift register of the gate driving circuit 520 of FIG. 6. The LCD 500 of the present invention includes a display array 510, a control circuit 524, and a gate driving circuit 520. The display array 510 is utilized for displaying images. The control circuit 524 is utilized for generating signals required by the gate driving circuit 520 during operation, such as a first clock signal CK, a second clock signal XCK, and a start signal ST. The gate driving circuit 520 is then utilized for driving the display array 510. The gate driving circuit includes a plurality of shift registers 522 coupled in a cascade. Each shift register generates gate signals GOUT to drive the display array 510 in response to the first clock signal CK and the second clock signal XCK. Each shift register 522 of the signal generating circuit 710 has a first switch and a second switch, such as $TFT_{60}$ and $TFT_{57}$. As illustrated in FIG. 7, the $TFT_{57}$ (i.e., the second switch) of the signal generating circuit 710 is utilized for generating a gate signal GOUT(N) at an output end OUT of the shift register 522 according to the first clock signal CK (or the second clock signal XCK) while the $TFT_{57}$ is turned on, and the $TFT_{60}$ (i.e., the first switch) of the signal generating circuit 710 is utilized for generating a feedback signal FS(N) at a feedback output end FBO of the shift register 522 according to the first clock signal CK (or the second clock signal XCK) while the $TFT_{60}$ is turned on. A driving circuit 720 is utilized for controlling the $TFT_{60}$ and the $TFT_{57}$ of the signal generating circuit 710 according to an input signal received by an input end IN of the shift register 522, and the input signal received by the input end IN of the shift register 522 is either a gate signal GOUT (N-1) or a start signal (ST) from an output end of the shift register of the previous stage. A reset circuit 730 is utilized for turning off the $TFT_{60}$ and $TFT_{57}$ of the signal generating circuit 710, and for resetting the gate signal GOUT(N) from the output end OUT (in another words to lower the voltage of the output end OUT to the voltage VSS). A control switch 740 is utilized for resetting the gate signal GOUT(N) from the output end OUT in response to the feedback signal received by the feedback end FB, and the feedback signal received by the feedback end FB is a feedback signal FS (N+1) from the feedback output end FBO of the shift register of the previous stage.

As a feedback signal FS received by the control switch 740 of each shift register 522 is generated by the first switch of the signal generating circuit of the shift register of the previous stage to replace a gate signal GOUT(N+1) from the output end of a shift register of the next stage, which also means that the control circuit 740 can reset the gate signal GOUT(N) from the output end OUT in response to the feedback signal FS(N+1) generated by the first switch of the signal generating circuit of the shift register of the next stage, it is not required that the output end OUT of the shift register 522 be coupled to a feedback end of a previous shift register. As a result, load of the output end OUT is lighten, and also the rising time of the gate signal GOUT from each shift register 522 is reduced.

Furthermore, the feedback signal FS generated by the first switch of the signal generating circuit 710 only provides to the control switch of the shift register of the previous stage, and thus the feedback signal FS received by the shift register of the previous stage will not weaken and also the falling time of the gate signal GOUT from the shift register 122 of the previous stage will be reduced. Therefore, the shift register 522 has a shorter response time than the conventional shift register.

Figure 8:
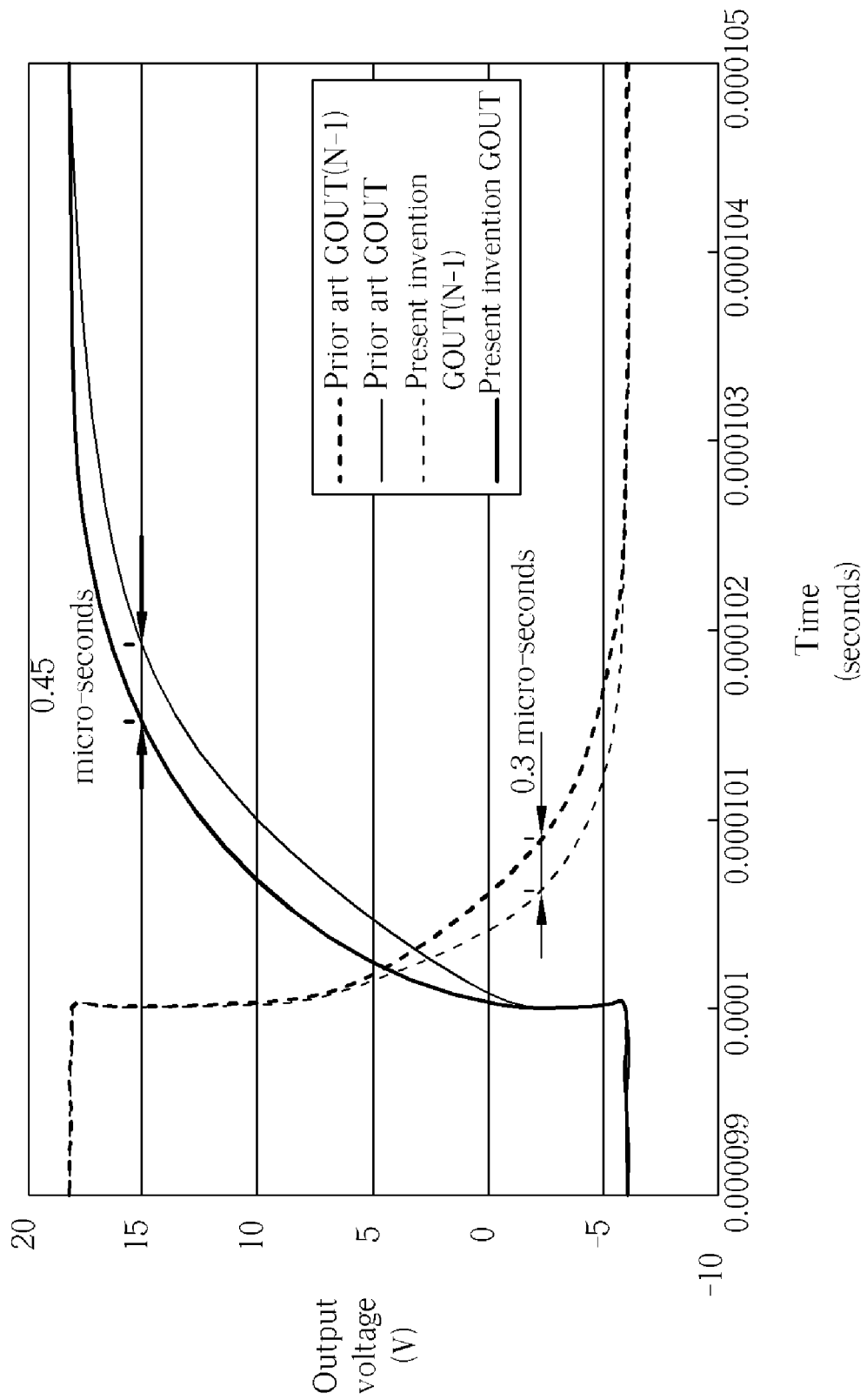
FIG. 8 illustrates a comparison diagram of a gate signal GOUT from a shift register of an embodiment of the present invention and a gate signal GOUT from a conventional shift register.

FIG. 8 illustrates a comparison diagram of a gate signal GOUT from a shift register 522 of one embodiment of the present invention and a gate signal GOUT from a conventional shift register 122. As illustrated in FIG. 8, a circuit simulation conducted by SPICE (a well-known general-purpose circuit simulation program) shows that the rising time of a gate signal GOUT(N) from an N stage shift register 522 of the present invention is 0.45 micro-seconds faster than the rising time of a gate signal GOUT(N) from a conventional shift register 122, and the falling time of a gate signal GOUT (N−1) from shift register 522 of the N−1 stage of the present invention is 0.30 micro-second faster than the falling time of a gate signal GOUT(N−1) from a conventional shift register 122 of the N−1 stage.

In conclusion, the signal generating circuit 710 of the shift register 522 of the present invention includes a first switch $TFT_{60}$ and a second switch $TFT_{57}$. The first switch $TFT_{60}$ is utilized for generating a feedback signal FS at the feedback output end FBO of the shift register 522, and the second switch $TFT_{57}$ is utilized for generating a gate signal GOUT at the output end OUT of the shift register 522. Therefore, it is not required that the gate signal GOUT from each shift register 522 be coupled to a feedback end of a previous shift register, and the feedback signal FS is provided by the first switch $TFT_{60}$ at the feedback output end FBO.

The output end OUT of the shift register 522 of the present invention is not required to be coupled to the feedback end FB of the shift register 522 of the previous stage. In this way, the load of the output end OUT of each shift register 522 can be lighten, and also the rising time and the falling time of the gate signal GOUT can be reduced. Therefore, the shift register 522 of the present invention has a shorter response time than the prior art shift register.

Those skilled in the art will readily observe that numerous modifications and alterations of the device and method may be made while retaining the teachings of the invention.

What is claimed is:

1. A shift register circuit comprising a first shift register, a second shift register, and a third shift register, each of the three shift registers having an input end and an output end, each of the three shift registers comprising:
   a signal generating circuit comprising:
   a first switch for generating a first output signal according to a clock signal when the first switch is turned on; and
   a second switch coupled to the output end of the shift register, for generating a second output signal according to a clock signal when the second switch is turned on, and for transmitting the second output signal to the output end of the shift register;
   a drive circuit coupled to the first switch and the second switch of the signal generating circuit, for controlling the first switch and the second switch of the signal generating circuit according to an input signal received by the input end of the shift register;
   a reset circuit coupled to the signal generating circuit, for turning off the first switch and the second switch of the signal generating circuit and for resetting an output signal outputted by the output end; and
   a control switch coupled to the output end of the shift register, for resetting the output signal outputted by the output end.

2. The shift register of claim 1, wherein the first switch of the signal generating circuit of the second shift register is coupled to a feedback end of the first shift register for generating an output signal to be transmitted to the control switch of the first shift register according to the clock signal when the first switch is turned on.

3. The shift register of claim 1, wherein the control switch of the second shift register is further coupled to the signal generating circuit of the third shift register.

4. The shift register of claim 1 wherein the first switch and the second switch are thin film transistors (TFTs).

5. A liquid crystal display (LCD) comprising:
   a display array; and
   a gate driving circuit for generating a plurality of gate signals to drive the display array, the gate driving circuit including a first shift register, a second shift register, and a third shift register, each of the three shift registers including an input end and an output end, each of the three shift registers comprising:
   a signal generating circuit, comprising:
   a first switch for generating a first output signal according to a clock signal when the first switch is turned on;
   a second switch, coupled to the output end of the shift register, for generating a second output signal according to a clock signal when the second switch is turned on, and for transmitting the second output signal to the output end of the shift register;
   a drive circuit, coupled to the first switch and the second switch of the signal generating circuit, for controlling the first switch and the second switch of the signal generating circuit according to an input signal received by the input end of the shift register;
   a reset circuit, coupled to the signal generating circuit, for turning off the first switch and the second switch of the signal generating circuit and for resetting an output signal outputted by the output end; and
   a control switch, coupled to the output end of the shift register, for resetting the output signal outputted by the output end.

6. The LCD of claim 5, wherein the first switch of the signal generating circuit of the second shift register is coupled to a feedback end of the first shift register for generating an output signal to be transmitted to a control switch of the first shift register according to the clock signal when the first switch is turned on.

7. The LCD of claim 5, wherein the control switch of the second shift register is coupled to a signal generating circuit of the third shift register.

8. The LCD of claim 5, further comprising a control circuit coupled to the gate driving circuit for generating the clock signal, and for generating a start signal at an input end of the first shift register of the gate driving circuit.

9. The LCD display of claim 5, wherein the first switch and the second switch comprise thin film transistors.

10. A shift register circuit comprising a first shift register, a second shift register, and a third shift register coupled in series, each of the three shift registers having an input end and an output end, at least two of the three shift registers comprising:
   a signal generating circuit comprising:
   a first switch for generating a first output signal according to a clock signal when the first switch is turned on; and a second switch coupled to the output end of the shift register, for generating a second output signal according to a clock signal when the second switch is turned on, and for transmitting the second output signal to the output end of the shift register;

a drive circuit coupled to the first switch and the second switch of the signal generating circuit, for controlling the first switch and the second switch of the signal generating circuit according to an input signal received by the input end of the shift register;

a reset circuit coupled to the signal generating circuit, for turning off the first switch and the second switch of the signal generating circuit and for resetting an output signal outputted by the output end; and a control switch coupled to the output end of the shift register, for resetting the output signal outputted by the output end, a control terminal of the control switch coupled to receive the first output signal from a next shift register of the three shift registers.

11. The shift register of claim 10, wherein the first switch of the signal generating circuit of the second shift register is coupled to a feedback end of the first shift register for generating an output signal to be transmitted to the control switch of the first shift register according to the clock signal when the first switch is turned on.

12. The shift register of claim 10, wherein the control switch of the second shift register is further coupled to the signal generating circuit of the third shift register.

13. The shift register of claim 10 wherein the first switch and the second switch are thin film transistors (TFTs).

14. A liquid crystal display (LCD) comprising:
a display array; and
a gate driving circuit for generating a plurality of gate signals to drive the display array, the gate driving circuit including a first shift register, a second shift register, and a third shift register coupled in series, each of the three shift registers including an input end and an output end, the first and second shift registers each comprising:

a signal generating circuit, comprising:
a first switch for generating a first output signal according to a clock signal when the first switch is turned on;
a second switch, coupled to the output end of the shift register, for generating a second output signal according to a clock signal when the second switch is turned on, and for transmitting the second output signal to the output end of the shift register;
a drive circuit, coupled to the first switch and the second switch of the signal generating circuit, for controlling the first switch and the second switch of the signal generating circuit according to an input signal received by the input end of the shift register;
a reset circuit, coupled to the signal generating circuit, for turning off the first switch and the second switch of the signal generating circuit and for resetting an output signal outputted by the output end; and
a control switch, coupled to the output end of the shift register, for resetting the output signal outputted by the output end, a control terminal of the control switch coupled to receive the first output signal from a next shift register of the three shift registers.

15. The LCD of claim 14, wherein the first switch of the signal generating circuit of the second shift register is coupled to a feedback end of the first shift register for generating an output signal to be transmitted to a control switch of the first shift register according to the clock signal when the first switch is turned on.

16. The LCD of claim 14, wherein the control switch of the second shift register is coupled to a signal generating circuit of the third shift register.

17. The LCD of claim 14, further comprising a control circuit coupled to the gate driving circuit for generating the clock signal, and for generating a start signal at an input end of the first shift register of the gate driving circuit.

18. The LCD display of claim 14, wherein the first switch and the second switch comprise thin film transistors.

* * * * *